(12) United States Patent
Yoshikawa

(10) Patent No.: US 8,547,113 B2
(45) Date of Patent: Oct. 1, 2013

(54) CAPACITIVE TOUCH PANEL

(75) Inventor: Osamu Yoshikawa, Tokyo (JP)

(73) Assignee: SMK Corporation, Tokyo (JP)

( * ) Notice: Subject to any disclaimer, the term of this patent is extended or adjusted under 35 U.S.C. 154(b) by 219 days.

(21) Appl. No.: 13/251,299

(22) Filed: Oct. 3, 2011

(65) Prior Publication Data

US 2012/0019265 A1   Jan. 26, 2012

Related U.S. Application Data

(63) Continuation of application No. PCT/JP2010/004707, filed on Jul. 23, 2010.

(30) Foreign Application Priority Data

Mar. 4, 2010   (JP) .................................. 2010-047642

(51) Int. Cl.
 *G01R 27/26*   (2006.01)
(52) U.S. Cl.
 USPC ............................ 324/677; 324/683; 345/174
(58) Field of Classification Search
 USPC .................. 324/658, 677, 679–683; 345/174
 See application file for complete search history.

(56) References Cited

U.S. PATENT DOCUMENTS

2012/0154323 A1* 6/2012 Nambu ......................... 345/174

FOREIGN PATENT DOCUMENTS

| JP | 2005-337773 A | 12/2005 |
| JP | 2009-70004 A | 4/2009 |

* cited by examiner

*Primary Examiner* — Vincent Q Nguyen

(57) ABSTRACT

Changes of the stray capacitances of a large number of sensing electrodes can be detected simultaneously. Further, even if a stray capacitance changes slightly, an input operation to a sensing electrode can be detected based on elapsed time until the electric potential of the sensing electrode becomes the same as a threshold potential. The stray capacitance of a sensing electrode and a resistor of the sensing electrode form a CR time constant circuit. Charge or discharge of the stray capacitance of the sensing electrode is controlled while a rest time in a predetermined time ratio is set. A stray capacitance that slightly increases in response to an input operation made near a sensing electrode can be detected by detecting the stray capacitance in extended elapsed time until the electric potential of the sensing electrode becomes the same as the threshold potential.

3 Claims, 5 Drawing Sheets

CAPACITIVE TOUCH PANEL

CROSS REFERENCE TO RELATED APPLICATION

The contents of the following Japanese patent application and International patent application are incorporated herein by reference:
Japanese Patent Application NO. 2010-047642 filed on Mar. 4, 2010, and
International Patent Application NO. PCT/JP2010/004707 filed on Jul. 23, 2010.

BACKGROUND

1. Technical Field

The invention relates to a capacitive touch panel for detecting an input operation in a noncontact manner made to a sensing electrode arranged on an insulating panel based on increase of the stray capacitance of the sensing electrode.

2. Related Art

A capacitive touch panel is known as a pointing device for designating an item such as an icon displayed on a display of an electronic device. An electrostatic capacitance changes near a position on an entry screen as an input unit such as a finger is approaching. By making use of this phenomenon, the capacitive touch panel can detect an input operation in a noncontact manner based on the change of the electrostatic capacitance even if the capacitive touch panel is placed on the rear side of the display.

A conventional capacitive touch panel includes a large number of insulated X electrodes and a large number of insulated Y electrodes arranged in a matrix on an entry screen such that the X electrodes and the Y electrodes cross each other. An electrostatic capacitance changes between each of the X electrodes and a Y electrode crossing each other near a position where an input unit such as a finger approached, thereby detecting an input operation made at the positions of the X and Y electrodes having changed in electrostatic capacitance (as disclosed in paragraphs 0017 to 0031 of the specification and FIG. 1 of Japanese Patent Application Publication No. 2005-337773).

In the capacitive touch panel disclosed in Japanese Patent Application Publication No. 2005-337773, a predetermined pulse voltage is applied sequentially to a large number of Y electrodes to scan the Y electrodes. The voltage of an X electrode that crosses the Y electrode having received the pulse voltage is detected. In response to approach of an input unit such as a finger to an insulating panel, an electrostatic capacitance changes between X and Y electrodes crossing each other at a position where the input unit is approaching. Accordingly, based on the position of the X electrode having changed in voltage as a result of the change in the electrostatic capacitance and the position of the Y electrode having received the applied pulse voltage at that time, the position of the operation made by the input unit on the insulating panel is detected.

If an entry screen of an insulating panel is increased in area, the number of X electrodes and the number of Y electrodes subjected to detection of the change of an electrostatic capacitance are increased in response to the increase of the input area. This results in a longer scanning cycle during which the crossing points of respective electrodes are scanned, making it impossible to detect an input position in a short time. In addition to the necessity to provide means for applying a pulse voltage, scanning of the large numbers of X and Y electrodes arranged in a matrix requires the use of multiplexers in number corresponding to the numbers of the X and Y electrodes. There is the problem in that the circuit configuration is complicated and increased in size.

Accordingly, a method of detecting an unknown electrostatic capacitance at an input position based on a time constant between the electrostatic capacitance and a known resistance value is known as means for detecting the change of the electrostatic capacitance (stray capacitance) of a sensing electrode with a simpler circuit configuration. In this detection method, a sensing resistor R is connected in series or in parallel with a capacitor C of an electrostatic capacitance that is an unknown capacitance to form a CR time constant circuit. A predetermined voltage Vdd is applied to one end of the sensing resistor R, or one end of the sensing resistor R is grounded. The electric potential of the capacitor C that increases or decreases depending on a time constant rc determined by the electrostatic capacitance c of the capacitor C and the resistance value r of the sensing electrode R is compared with a predetermined threshold potential. Then, the magnitude of an electrostatic capacitance is determined based on charging or discharging time until the threshold potential is achieved. The stray capacitance of a sensing electrode disposed on an insulating panel (electrostatic capacitance between the sensing electrode and the ground) increases to make charging and discharging times longer in response to approach of an input unit such as a finger. Accordingly, by employing the aforementioned detection method, charging and discharging times until the capacitance of the sensing electrode becomes the same as a predetermined threshold potential are measured, and the measured times are compared with charging and discharging times obtained when no input operation is made. As a result, the presence or absence of an input operation made near the sensing electrode can be determined.

However, a stray capacitance c increases only by some picofarads from about 10 pF in response to approach of a finger to a sensing electrode. Accordingly, a time constant changes only by 10 μsec even if the detection method using the CR time constant circuit includes sensing resistors of 10 MΩ connected in series in order to detect an electrostatic capacitance to increase by 1 pF, for example. This makes it quite difficult to detect an input operation made to a sensing electrode directly from comparison of charging times or discharging times until a threshold potential is achieved. This problem may be solved by increasing the resistance value of the sensing resistor further. However, this in turn generates the condition of a high impedance close to an insulated condition to cause flow of a sensing current in a microcomputer and the like for applying a sensing voltage, making detection impossible. In view of these facts, the following electrostatic capacitance detection method of a charge transfer scheme is suggested (as disclosed in paragraphs 0014 to 0020 of the specification and FIG. 2 of Japanese Patent Application Publication No. 2009-70004). In this electrostatic capacitance detection method, a capacitor of a higher capacitance is prepared, and electric charges stored in a stray capacitance are repeatedly transferred to this capacitor to compare charging times of the capacitor.

The electrostatic capacitance detection method of a charge transfer scheme will be described next by referring to FIGS. 5 and 6. A capacitor C1 shown in FIG. 5 of a small capacitance c1 is used for detection of capacitor change. As an example, the capacitor C1 has a minute stray capacitance generated between a finger of an operator and a pattern. One side of the capacitor C1 is grounded through the operator. The capacitor C1 is charged with a charge voltage Vdd while SW1 on the opposite side is ON. A capacitor C2 of a capacitance c2 sufficiently higher than the electrostatic capacitance of the capacitor C1 is connected in parallel with the capacitor C1 through SW2.

In a detection circuit of the aforementioned structure, SW1 and SW2 are turned ON and OFF, respectively, to charge the capacitor C1 with the charge voltage Vdd in a first step. After the charging, SW1 and SW2 are both turned OFF in a second step. The voltage V1 of the capacitor C1 is equal to Vdd in the second step. Next, in a third step, SW1 and SW2 are turned OFF and ON, respectively, so that electric charges stored in the capacitor C1 are transferred in part to the capacitor C2. Then, SW1 and SW2 are both turned OFF again in a fourth step. In the fourth step, the voltages V1 and V2 of the capacitors C1 and C2 are equal to each other.

The voltage V2 of the capacitor C2 after repeating the processes of the first to fourth steps the number of times N is expressed as $V2=Vdd\times(1-c2/(c1+C2))^N$. Further, the charge voltage Vdd and the capacitance c2 of the capacitor C2 are known here. Accordingly, the electrostatic capacitance c1 of the capacitor C1 to be detected can be obtained by determining the number of times N until the voltage V2 of the capacitor C2 reaches a threshold potential Vref shown in FIG. 6 that is set to be half the charge voltage Vdd.

As shown in FIG. 6, the repeat count N becomes small until Vref is achieved, with the increased electrostatic capacitance c1. Accordingly, in a capacitive touch panel that has only to detect approach of an input unit to a sensing electrode, a threshold Nref of a repeat count is set, for example, to 1100 in the figure. It is determined that a stray capacitance of 10 pF or higher is generated in response to approach of a finger making an input operation if Vref is achieved by a repeat count lower than the threshold Nref, thereby detecting the input operation to a sensing electrode.

The conventional capacitive touch described in Japanese Patent Application Publication No. 2005-337773 involves the application of a pulse voltage to each of all the sensing electrodes, and accordingly, it desirably employs a detection method with a CR time constant circuit capable of detecting changes of an electrostatic capacitance in a shorter time by simultaneously charging or discharging the stray capacitances of all the sensing electrodes. Meanwhile, a stray capacitance changes slightly in response to an input operation, making it difficult to detect this change based on a difference in charging or discharging times until a threshold potential is achieved. This change can be detected only by being made greater by the charge transfer scheme described in Japanese Patent Application Publication No. 2009-70004.

However, this charge transfer scheme involves controls of the operations of SW1 and SW2 1000 times or more in order to detect one change of an electrostatic capacitance, making it impossible to detect an input operation made near a sensing electrode in a short time based on the change of a stray capacitance.

The invention has been made in view of the aforementioned conventional problems. It is an object of the invention to provide a capacitive touch panel capable of detecting changes of the stray capacitances of a large number of sensing electrodes simultaneously and also capable of detecting an input operation to a sensing electrode based on charging and discharging times until a threshold potential is achieved even if the stray capacitances change slightly.

It is also an object of the invention to provide a capacitive touch panel capable of selecting a method of controlling a voltage with a higher degree of detection accuracy according to a charge voltage Vdd or a threshold potential to be compared with the electric potential Vc of a sensing electrode.

SUMMARY

In order to achieve the aforementioned objects, a capacitive touch panel as recited in claim 1 for detecting an input operation made at a position of a sensing electrode based on elapsed time that increases as a result of increase of a stray capacitance, the capacitive touch panel including: a sensing electrode arranged on an insulating panel, the sensing electrode increasing in stray capacitance in response to approach of an input unit; a resistive element forming a CR time constant circuit between the resistive element and a value of the stray capacitance of the sensing electrode; a charge and discharge switch for raising an electric potential of the sensing electrode from a ground potential to a predetermined charge potential or reducing the electric potential of the sensing electrode from the charge potential to the ground potential by connecting a common terminal on one side of the resistive element to a switching terminal that is either at the charge potential or at the ground potential from a base point in time to charge or discharge the stray capacitance with the time constant of the CR time constant circuit; and time measuring means for measuring elapsed time for the electric potential of the sensing electrode at the charge potential or ground potential to become the same as a predetermined threshold potential between the charge potential and the ground potential by charging or discharging the stray capacitance from the base point in time. The switching of the charge and discharge switch is controlled by a PWM modulated signal obtained by pulse-width modulating a rectangular wave pulse signal at a fixed frequency by a predetermined modulation value. The common terminal on one side of the resistive element is connected with or separated from the switching terminal in response to a binary signal value of the PWM modulated signal.

The binary signal value of the PWM modulated signal for controlling the switching of the charge and discharge switch has a duty ratio that changes in response to the modulation value. The one side of the resistive element is switched alternately between the charge or ground potential, and an open potential by a time interval ratio determined by the modulation value. While the one side of the resistive element is at the charge or ground potential, the electric potential of the sensing electrode that is either the ground or charge potential increases or decreases according to the time constant determined by the resistance value of a resistor and the stray capacitance. While the one side of the resistive element is at the open potential, the electric potential of the sensing electrode does not change, so that the increase or decrease of the electric potential stops. Thus, elapsed time from the base point in time until the electric potential of the sensing electrode becomes the same as the threshold potential can be extended in response to the modulation value by making the gradient of change of the electric potential of the sensing electrode smaller during charge or discharge of the stray capacitance. As a result, even slight increase of the stray capacitance in response to an input operation can be detected from the increment of the extended elapsed time.

In the capacitive touch panel as recited in claim 2, the PWM modulated signal controls switching of connection of the common terminal of the charge and discharge switch among a first switching terminal at the charge voltage, a second switching terminal at the ground potential, and an open third switching terminal, and the connection of the common terminal is switched in response to the binary signal value of the PWM modulated signal between the first and third switching terminals to charge the stray capacitance of the sensing electrode, and/or between the second and third switching terminals to discharge the stray capacitance of the sensing electrode.

The connection of the common terminal is switched between the first and third switching terminals during charge control of the stray capacitance. The connection of the common terminal is switched between the second and third switching terminals during discharge control. Thus, in either case, elapsed time from the base point in time until the electric potential of the sensing electrode becomes the same as the threshold potential can be extended by the same charge and discharge switch in response to the modulation value.

In the capacitive touch panel as recited in claim 3, the resistive element and the charge and discharge switch are prepared for each one of a plurality of sensing electrodes arranged on an insulating panel while being insulated from each other. The elapsed times of the sensing electrodes measured by the time measuring means are compared, so that an input position is detected based on the position of a sensing electrode that increases in elapsed time.

Changes of the stray capacitances of the many sensing electrodes are each detected by using the CR time constant circuit. This makes it possible to charge or discharge the stray capacitances of the many sensing electrodes simultaneously, so that an input operation to any one of the sensing electrodes can be detected in a short time.

According to the invention as recited in claim 1, an input operation to the sensing electrode can be detected by using the CR time constant circuit even if the stray capacitance of the sensing electrode increases slightly in response to the input operation.

According to the invention as recited in claim 2, regardless of whether the change of the stray capacitance is detected by charging the stray capacitance or by discharging the stray capacitance, elapsed time from the base point in time until the electric potential of the sensing electrode becomes the same as the threshold potential can be extended by the same charge and discharge switch in response to the modulation value, so that the stray capacitance that changes slightly can be detected reliably.

The gradient of change of the voltage of sensing electrodes differs between when the stray capacitance is charged and when the stray capacitance is discharged according to elapsed time from the base point in time. This makes it possible to select either the charge or discharge control of the stray capacitance according to the threshold potential to make the gradient of the electric potential of the sensing electrode smaller in the vicinity of the threshold potential, while making the change of the stray capacitance appear in extended elapsed time.

According to the invention as recited in claim 3, changes of the stray capacitances of the many sensing electrodes arranged on the insulating panel can be detected in one cycle of the charge and discharge controls of the stray capacitances, so that an input position can be detected in a short period.

DESCRIPTION OF EXEMPLARY EMBODIMENTS

A capacitive touch panel (hereinafter called a touch panel) 1 according to an embodiment of the invention will be described below by using FIGS. 1 to 4. The touch panel 1 includes a plurality of sensing electrodes $3_1$, $3_2$, $3_3$ and $3_4$ formed on an insulating panel not shown with an insulation distance of some millimeters therebetween, for example. The stray capacitance Cs of each of the sensing electrodes 3 is expressed as a total of the capacitance of a surrounding conductive pattern, capacitance of a shield case to shield a unit, and capacitance formed between the sensing electrode and the ground. The stray capacitance Cs increases in response to approach of an input unit such as a finger while other capacitances are kept at substantially constant levels. The stray capacitances $Cs_1$, $Cs_2$, $Cs_3$ and $Cs_4$ of the respective sensing electrodes 3 are compared, and a sensing electrode 3 having the highest stray capacitance Cs compared with the others is regarded as that an input unit having made an input operation approached, thereby detecting the input operation made near the position of this sensing electrode 3.

Figure 1:
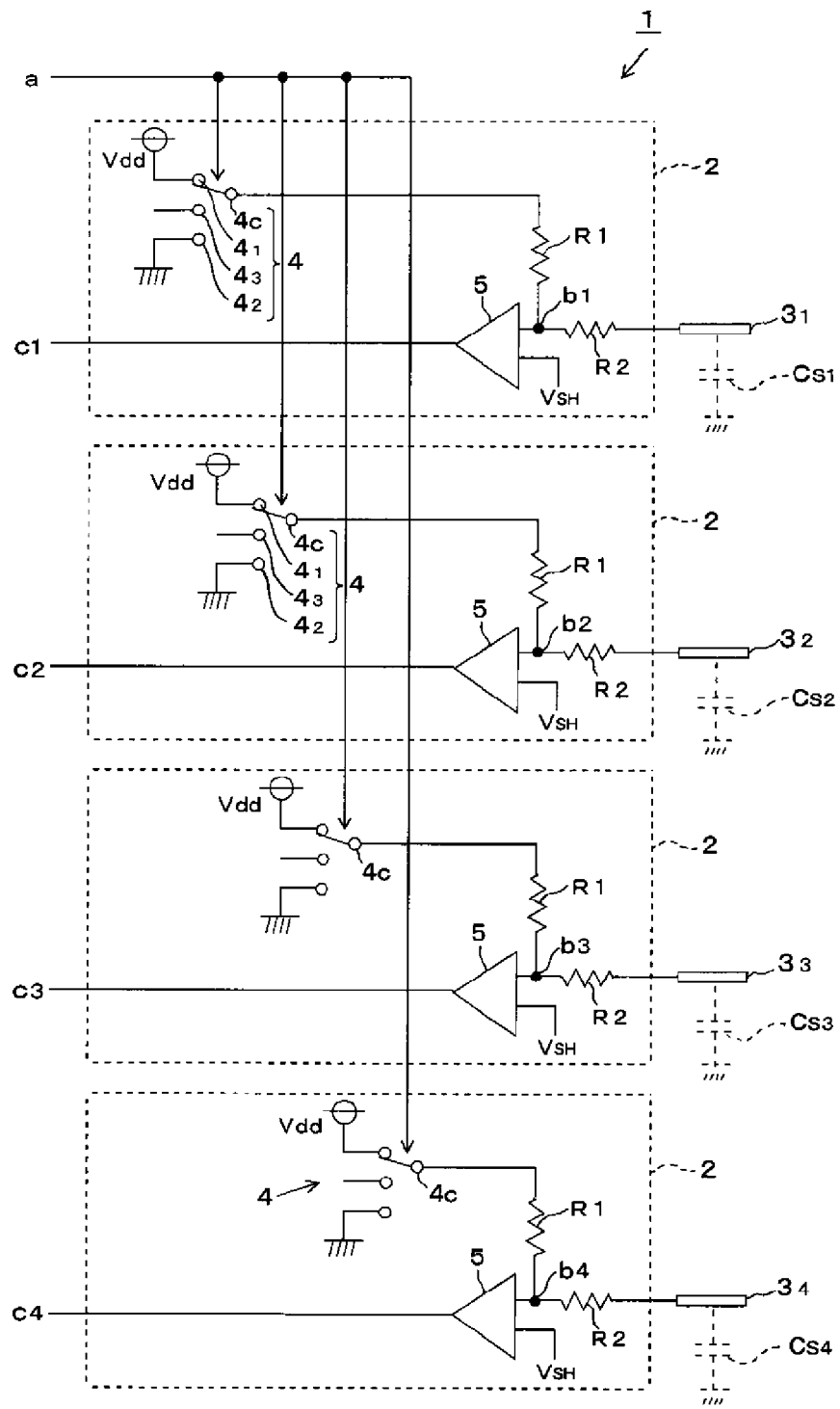
FIG. 1 shows a circuit diagram showing a plurality of sensing electrodes 3 and capacitance-time conversion circuits 2 of a capacitive touch panel 1 according to an embodiment of the invention.

Here, for the convenience of description, it is assumed that the touch panel 1 compares the stray capacitances $Cs_1$, $Cs_2$, $Cs_3$ and $Cs_4$ of the four sensing electrodes $3_1$, $3_2$, $3_3$ and $3_4$ to detect an input operation. For comparison of the stray capacitances $Cs_1$, $Cs_2$, $Cs_3$ and $Cs_4$ of the respective sensing electrodes 3, as shown in FIG. 1, capacitance-time conversion circuits 2 for outputting the stray capacitances Cs expressed as time intervals of binary signals c are connected to the respective sensing electrodes 3.

The capacitance-time conversion circuits 2 each include: a charge and discharge switch 4 with a common terminal 4c the connection of which is switched among a first switching terminal $4_1$ at a reference charge voltage Vdd, a second switching terminal $4_2$ at a ground potential GND, and an open third switching terminal $4_3$; sensing resistors R1 and R2 disposed between the common terminal 4c of the charge and discharge switch 4 and the sensing electrode 3; and a comparator 5 having a non-inverting input connected to a node between the sensing resistors R1 and R2, and an inverting input at a threshold potential $V_{SH}$. The sensing resistor R2 is a resistor of the sensing electrode 3. The sensing resistors R1 and R2 connected in series with a capacitor with the stray capacitance Cs of the sensing electrode 3 form a CR time constant circuit.

The threshold potential $V_{SH}$ is an arbitrary potential between the reference charge voltage Vdd and the ground potential GND, and here, is set 70% of the electric potential of Vdd. Accordingly, when the common terminal 4c of the charge and discharge switch 4 is switched from the second switching terminal $4_2$ at the ground potential GND to the first switching terminal $4_1$ at the reference charge voltage Vdd, the stray capacitance Cs is charged with a time constant csr determined by the resistance values r of the sensing resistors R1 and R2, and the stray capacity cs of the stray capacitance Cs (for the convenience of description, the capacity of a capacitor having the stray capacitance Cs is called the stray capacity cs). The output c of the comparator 5 is inverted if the electric potential of the sensing electrode 3 increases from the ground potential GND to a level higher than the threshold potential $V_{SH}$.

Figure 4:
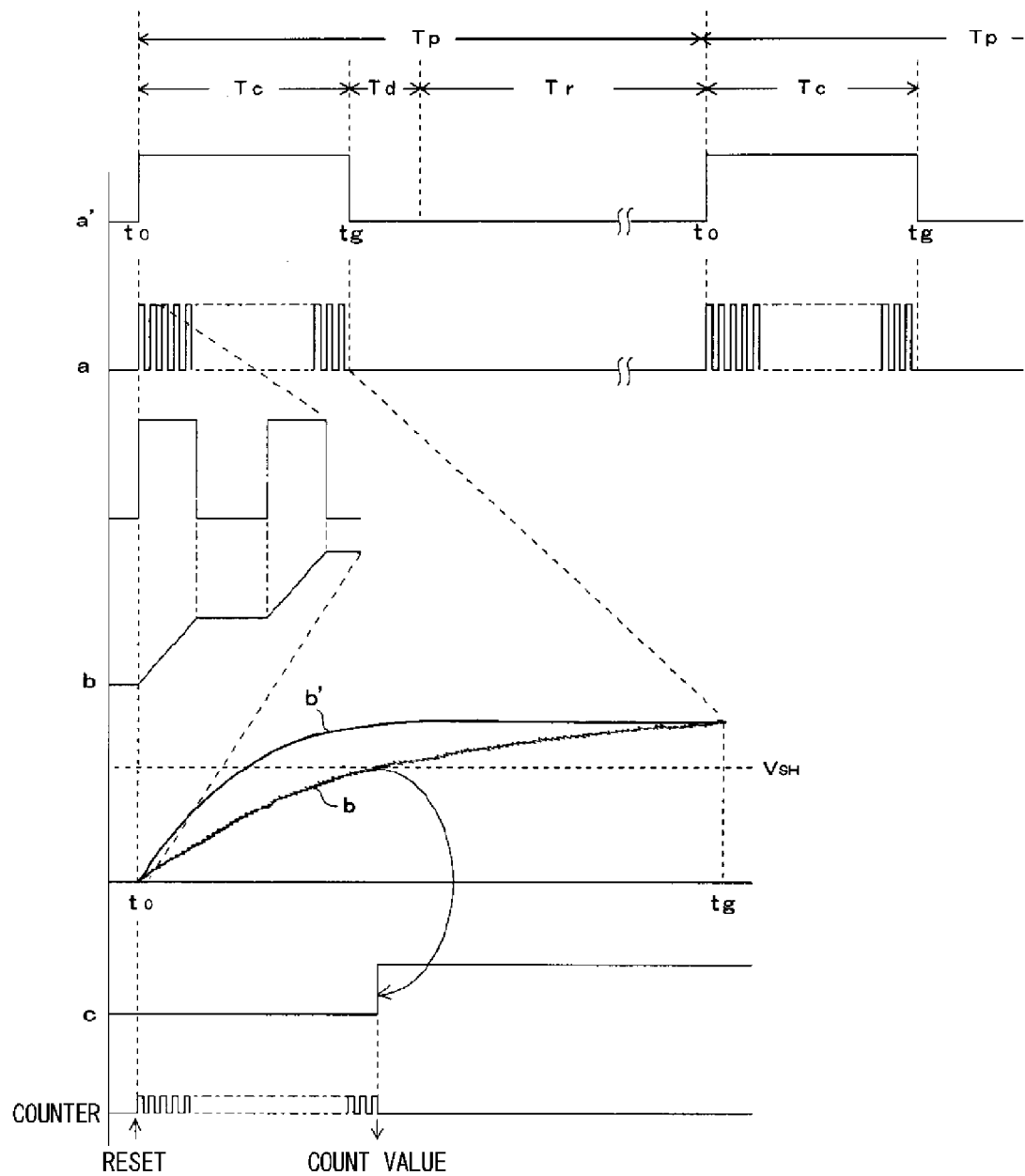
FIG. 4 shows a waveform chart in which waveforms a, b and c of FIG. 1 are compared with the waveforms a', b' and c' obtained in a conventional way, respectively.
Figure 5:
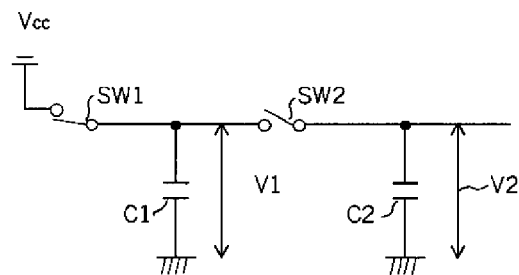
FIG. 5 shows a block diagram showing a conventional electrostatic capacitance detection method of a charge transfer scheme.
Figure 6:
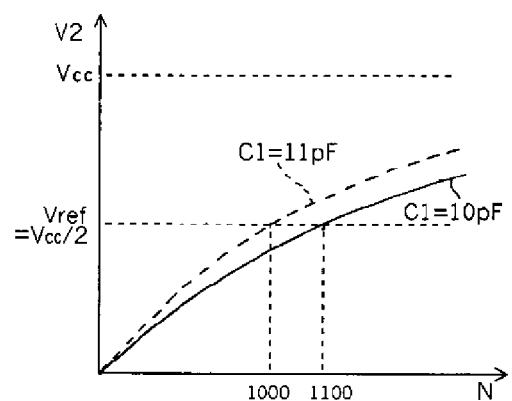
FIG. 6 shows a waveform chart explaining a relationship between the number of times N charge is performed and the voltage V2 of a capacitor C2 obtained in the electrostatic capacitance detection method shown in FIG. 5.

If switching of the charge and discharge switch 4 is controlled by a switching control signal a' which is always at "H" level and given from a microcomputer 5 in a charge control period Tc as shown in FIG. 4, the electric potential Vc of a sensing electrode that is at the ground potential GND at a base point in time t0 is expressed as follows:

$$Vc = Vdd(1-\epsilon^{-t/csr}) \quad (1)$$

where t is the time elapsed from the base point in time t0 when the charge voltage Vdd is applied, and ε is a natural logarithm. The electric potential Vc increases in a manner b' shown in the figure to become substantially the same as the charge voltage Vdd after elapse of a transitional period expressed as t=5 csr (for the convenience of description, this is called a state where the electric potential Vc becomes the same as the charge voltage Vdd in the present specification).

The electric potential Vc of the sensing electrode 3 during the charge control period Tc in which the stray capacitance Cs is charged with the reference charge voltage Vdd increases at a rate that is determined by a time constant obtained by multiplying the resistance values r of the sensing resistors R1 and R2 by the stray capacity cs. This rate entirely depends on the stray capacity cs. A voltage increases more slowly with increase of the stray capacity cs, leading to lengthen the time elapsed from the base point in time T0 until the output c of the comparator 5 is inverted. Meanwhile, the stray capacity cs of the sensing electrode 3 is generally about 10 pF, and the amount of change of the stray capacity cs to occur in response to approach of an input unit such as a finger is about 1 to about 3 pF. Accordingly, this change is difficult to be detected, since a difference in elapsed time until the output c is inverted is considerably short time of from 10 to 30 μsec even if the resistance values r of the sensing resistors R1 and R2 are increased to 10 MΩ.

Thus, in the present embodiment, a switching control signal a output from the microcomputer 5 makes switching of the connection of the common terminal 4c of the charge and discharge switch 4 between the first and third switching terminals $4_1$ and $4_3$ during the charge control period Tc. The switching control signal a is obtained by PWM modulating a rectangular wave pulse at a fixed frequency by a predetermined modulation value in a PWM modulation circuit 20 of the microcomputer 5 described later. The switching control signal a is a PWM modulated signal having a duty ratio D responsive to the modulation value. Here, a rectangular wave pulse signal at 2.5 MHz is PWM modulated, and the PWM modulated signal a having a pulse width of 0.16 μsec at "H" level in one cycle of 0.4 μsec and a duty ratio of 0.4 is output from the microcomputer 5.

The charge and discharge switch 4 connects the common terminal 4c to the first switching terminal $4_1$ at the reference charge voltage Vdd while the switching control signal (PWM modulated signal) a is at "H" level. The charge and discharge switch 4 connects the common terminal 4c to the open third switching terminal $4_3$ while the switching control signal a is at "L" level. As a result, as shown by an enlarged waveform b of FIG. 4, the electric potential Vc of a sensing electrode during the charge control period Tc increases according to the formula (1) given above while the switching control signal a is at "H" level, and is kept at the same potential while the switching control signal a is at "L" level. These processes are repeated. This means that the electric potential Vc of a sensing electrode does not increase while the switching control signal a is at "L" level. Thus, the gradient of increase becomes smaller at a ratio corresponding to the duty ratio D, so that the electric potential Vc increases slowly as shown by the waveform b of the figure.

The electric potential Vc of the sensing electrode 3 has the waveform b of a gradient more moderate than that of b'. Accordingly, the stray capacity cs changes by about 1 to 3 pF in response to an input operation while a difference in elapsed time is extended by 2.5 to a time of from 25 to 75 μsec from the base point in time t0 until the threshold potential $V_{SH}$ is achieved. Thus, the input operation can be detected well from the difference even if means for measuring elapsed time described later has low resolution.

In the present embodiment, the resistance values r of the sensing resistors R1 and R2, the circuit constant of the comparator 5 and the like, and the level of the threshold potential $V_{SH}$ are the same regarding the sensing electrodes $3_1, 3_2, 3_3$ and $3_4$. Further, switching controls of the charge and discharge switches 4 are all made simultaneously by the same switching control signal a given from the microcomputer 5 shown in FIG. 2. Accordingly, connections to the first switching terminal $4_1$ and to the third switching terminal $4_3$ are formed in synchronization with each other with respect to the base point in time t0.

The change of the stray capacity cs of the sensing electrode 3 in response to an input operation is detected in the same manner in a discharge control period Td after a switching time tg. The switching control signal a or a' controls switching of the charge and discharge switch 4. Regarding the electric potential Vc of a sensing electrode that is at the charge voltage Vdd at the switching time tg, the common terminal 4c of the charge and discharge switch 4 is connected to the second switching terminal $4_2$ at the ground potential GND to discharge the stray capacitance Cs with the time constant csr. The electric potential Vc of the sensing electrode is expressed as follows:

$$Vc = Vdd \times \epsilon^{-t'/csr} \quad (2)$$

where t' is the time elapsed from the switching time tg when the charge voltage Vdd is achieved. The electric potential Vc of the sensing electrode becomes substantially the same as the ground potential after elapse of a transitional period expressed as t'=5 csr (for the convenience of description, this is called a state where the electric potential Vc becomes the same as the ground potential in the present specification).

In order to detect the stray capacity cs that changes slightly in the discharge control period Td, a switching control signal a output from the microcomputer 5 makes switching of the connection of the common terminal 4c of the charge and discharge switch 4 between the second and third switching terminals $4_2$ and $4_3$. It is assumed that the switching control signal a mentioned here is the same signal as the switching control signal a described with reference to the charge control period Tc. The common terminal 4c is connected to the second switching terminal $4_2$ at the ground potential GND while the switching control signal a is at "H" level. The common terminal 4c is connected to the open third switching terminal $4_3$ while the switching control signal a is at "L" level. As a result, the electric potential Vc of a sensing electrode during the discharge control period Td increases according to the formula (2) given above while the switching control signal a is at "H" level, and is kept at the same potential while the switching control signal a is at "L" level. These processes are repeated. Thus, the electric potential Vc of the sensing electrode also decreases at a gradient that becomes smaller at a ratio corresponding to the duty ratio D, and a difference in elapsed time from the switching time tg until the threshold potential $V_{SH}$ is achieved generated by slight change of the stray capacity cs in response to an input operation is extended by 2.5 times that is the reciprocal of the duty ratio D. As a result, an input operation can be detected well from the difference also in the discharge control period Td.

The threshold potential $V_{SH}$ to be compared with the electric potential Vc of a sensing electrode may be near the charge voltage Vdd. In this case, in the former charge control, the electric potential Vc of the sensing electrode increases little with respect to elapsed time as the time is near the transitional period in the vicinity of the threshold potential $V_{SH}$. In the latter discharge control, the electric potential Vc of the sensing electrode drops largely in the vicinity of the threshold potential $V_{SH}$. Accordingly, the latter discharge control is preferable if the resolution of a comparison circuit for comparing the threshold potential $V_{SH}$ and the electric potential Vc of a sensing electrode is low, whereas the former charge control is preferable if the resolution of a time measuring circuit for measuring elapsed timed t is low.

Conversely, the threshold potential $V_{SH}$ to be compared with the electric potential Vc of a sensing electrode may be near the ground potential GND. In this case, in the former charge control, the electric potential Vc of the sensing electrode increases largely in the vicinity of the threshold potential $V_{SH}$. In the latter discharge control, the electric potential Vc of the sensing electrode drops little as the time is near the transitional period in the vicinity of the threshold potential $V_{SH}$. Accordingly, the former charge control is preferable if the resolution of the comparison circuit for comparing the threshold potential $V_{SH}$ and the electric potential Vc of a sensing electrode is low. The latter discharge control is preferable if the resolution of the time measuring circuit for measuring the elapsed timed t is low. Preferable control can be selected according to the level of the threshold potential $V_{SH}$ or the resolution of a detection circuit without the need to change a circuit configuration.

The outputs c1, c2, c3 and c4 of the comparators 5 of the capacitance-time conversion circuits 2 are input in parallel as four-bit parallel data to a first register (T) 6 that is a four-bit PIPO (parallel input parallel output) register. Each bit data of the parallel data corresponds to the value of a binary signal of each of the outputs c1, c2, c3 and c4, and is stored as "1" if the output is "H," and is stored as "0" if the output is "L." Parallel outputs from the first register (T) 6 are connected to parallel inputs to a second register (T-1) 7 that is also a four-bit PIPO register. The first register (T) 6 and the second register (T-1) 7 are connected to the common shift clock terminal (SFT) and the common reset output terminal (RESET) of the microcomputer 5. The first register (T) 6 and the second register (T-1) 7 make the inputs and outputs of four-bit register values stored therein each time they receive a shift clock from the clock terminal (SFT). The first register (T) 6 and the second register (T-1) 7 reset four-bit register values stored therein each time they receive a reset signal from the reset output terminal (RESET). To be specific, the first register (T) 6 holds the binary data of the respective outputs c1, c2, c3 and c4 stored as a four-bit register value when a shift clock is received until a next shift clock is received. Likewise, the second register (T-1) 7 holds the four-bit register value output from the first register (T6) until a next shift clock is received. When a trigger signal is input from a register value comparison circuit 8 described later, the first register (T) 6 stores a register value stored at that time in a RAM 10.

Each time a new four-bit register value of the outputs c1, c2, c3 and c4 is stored in the first register (T) 6, the register value comparison circuit 8 compares this register value and a register value stored in the second register (T-1) 7. The register value comparison circuit 8 outputs a trigger signal to the first register (T) 6 and a counter 11 described later if bit data of at least one of the four bits differs therebetween. Further, in the present embodiment, the register value comparison circuit 8 outputs a trigger signal in order to store a count value and a register value described later in association with each other in the RAM 10 also at the base point in time t0 when an input operation is detected. Since the register value stored in the second register (T-1) 7 is a register value that has been stored in the first register (T) 6 immediately before the latest shift clock is input, a trigger signal is output at the base point in time t0, and is also output if binary data of at least one of the outputs c1, c2, c3 and c4 changes.

The microcomputer 5 receives a clock signal from a clock issuing circuit. Here, the microcomputer 5 includes therein a divider circuit 21 for dividing the frequency of a clock signal of 20 MHz into 8 to make a frequency of 2.5 MHz, and the PWM modulation circuit 20 for pulse-width modulating a rectangular wave pulse signal of 2.5 MHz output from the divider circuit 21 by a predetermined modulation value. The microcomputer 5 controls the operations of the registers 6 and 7 with the clock signal of 2.5 MHz output from the divider circuit 21 and applied as the aforementioned shift clock. Further, the microcomputer 5 controls switchings of the charge and discharge switches 4 of the respective capacitance-time conversion circuits 2 with the PWM modulated signal output from the PWM modulation circuit 20 and applied as the switching control signal a.

In the present embodiment, the PWM modulated signal is modulated to obtain a pulse signal having a duty ratio of 0.4, and controls switchings of the charge and discharge switches 4 simultaneously as described above. Further, a difference in time until the binary data of the outputs c is inverted by an input operation is about 25 to 75 μsec as described above. Accordingly, the shift clock is set to have a frequency of at least 1 MHz or higher (with a cycle of 1 μsec or shorter) in order to reliably detect such a difference in time. Here, the frequency of the shift clock is 2.5 MHz with a cycle of 0.4 μsec.

The microcomputer 5 performs the following detection. The microcomputer 5 specifics a sensing electrode 3 an input unit is approaching based on a combination of a count value and a register value stored in association with each other in the RAM 10 for each detection cycle Tp shown in FIG. 4. Then, the microcomputer 5 detects an input operation made at the position of this sensing electrodes 3.

The counter 11 counts up the count value at a frequency which is obtained from a clock signal output from the clock oscillating circuit 9, and is the same as or higher than the frequency of the shift clock. The count value of the counter 11 is reset with the reset signal output from the microcomputer 5. When a trigger signal is received from the register value comparison circuit 8, the count value at that time is output to the RAM 10 as shown in FIG. 2.

Figure 2:
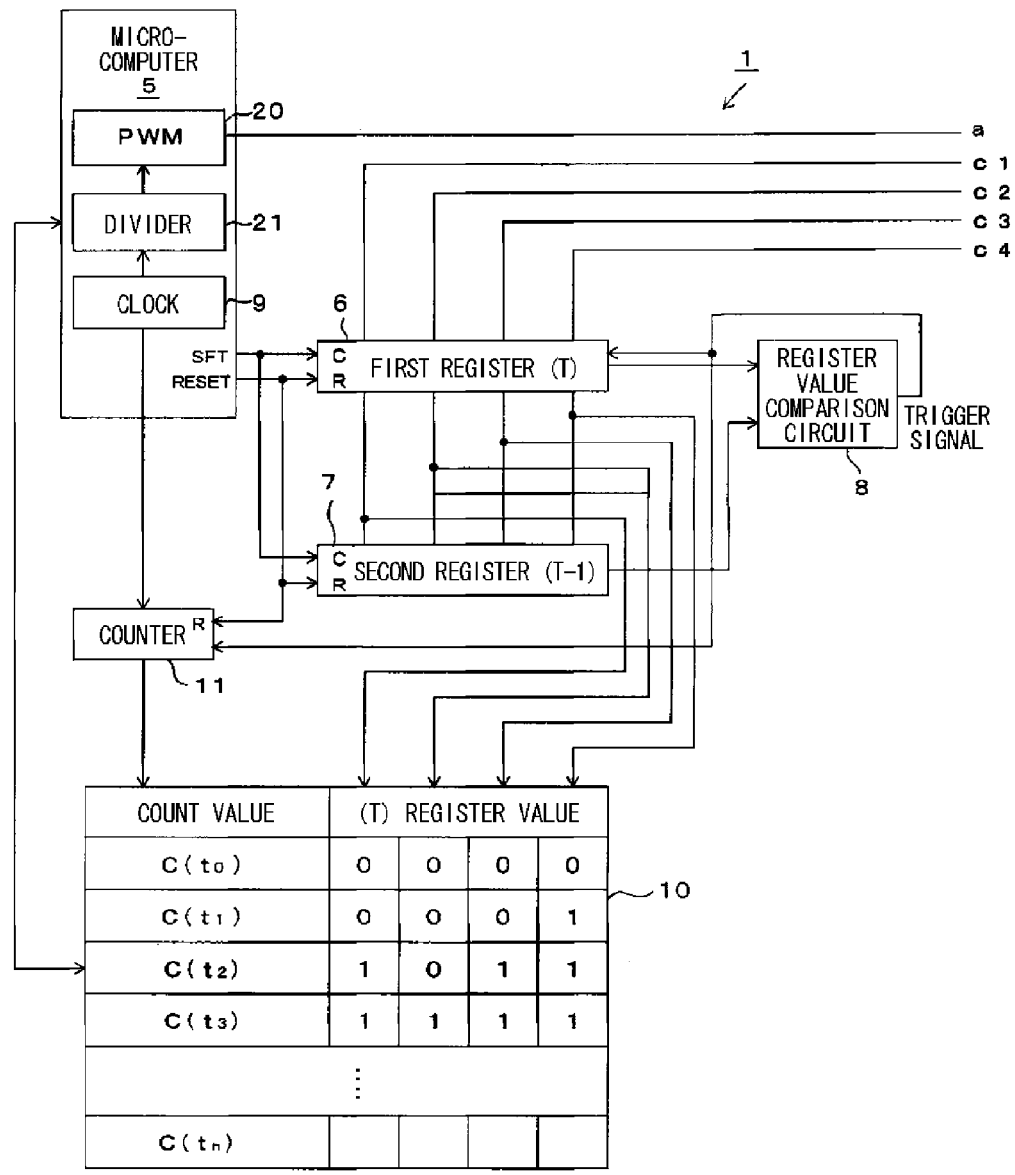
FIG. 2 shows a block diagram of an input position detecting circuit of the capacitive touch panel 1 for detecting an input operation.

As shown in FIG. 2, each time the register value comparison circuit 8 outputs a trigger signal, a count value of the counter 11 at that time and a register value stored in the first register (T) 6 at that time are stored in association with each other in the RAM 10 as a temporary storage device. The RAM 10 holds each combination associated with a count value until a register value the bit data thereof are all "0" is input. The data about each combination stored in the RAM 10 is cleared in each detection cycle Tp under control of the microcomputer 5 before the base point in time T0 comes.

An operation to detect an input operation by the touch panel 1 with the aforementioned structure will be described next. The microcomputer 5 repeats detection of an input operation in an operating mode for detecting an input operation in the detection cycle Tp including rest time Tr in addition to charging and discharging times Tc and Td in which the stray capacitance Cs of the respective sensing electrode 3 is charged and discharged. It is assumed here that an input operation is detected in the charging time Tc in which charge of the stray capacitance Cs is controlled. The charging time Tc is the time between the base point in time t0 when switchings of the charge and discharge switches 4 are switched to the first switching terminals $4_1$ at the reference charge voltage Vdd and the open third switching terminals $4_3$ and the switching time tg. The switching time tg is set as a time subsequent to a time when the electric potentials of all the sensing electrodes 3 exceed the threshold potential $V_{SH}$ to reach the reference charge voltage Vdd regardless of the presence or absence of an input operation. The highest value of the stray capacitance Cs is about 10 pF, and a time constant determined by the series-connected sensing resistors R1 and R2 at 10 MΩ is 100 μsec. Further, the time elapsed until the electric potentials of the sensing electrodes 3 the stray capacitances Cs of which are charged by the switching control signal a having a duty ratio of 0.4 become substantially the same as the reference charge voltage Vdd is 2.5 msec. Accordingly, the charging time Tc until the switching time tg is set at 3 msec.

An input operation is not detected during the charging time Td. Accordingly, as shown in FIG. 4, the switching control signal a after the switching time tg is at "L" level, and the common terminals 4c of the charge and discharge switches 4 are connected to the second switching terminals $4_2$ at the ground potential GND. As a result, the electric potentials of all the sensing electrodes 3 become the ground potential GND at a time after elapse of the discharging time Td from the switching time tg. The stray capacitances Cs are always discharged during the discharging time Td. Accordingly, the time elapsed until the ground potential GND is achieved from the switching time tg is set at 0.5 msec, and the discharging time Td is set at 1 msec shorter than the charging time Tc. In order to detect an input operation at a higher frequency, the time when the discharging time Td has elapsed may be set as the base point in time t0, so that the rest time Tr is not always required in the detection cycle Tp. However, in the present embodiment, the rest time Tr of 0.5 msec is provided to set the detection cycle Tp of 4 msec. The microcomputer 5 performs the detection during the discharging time Td and the rest time Tr by calculating an input position based on the data stored in the RAM 10.

In the present embodiment, the stray capacitances Cs of the many capacitance-time conversion circuits 2 are charged or discharged simultaneously. Accordingly, the number of the capacitance-time conversion circuits 2 will not extend the charging and discharging times Tc and Td, so that an input operation can be detected in the short detection cycle Tp even with the rest time Tr provided. This results in low power consumption even when the microcomputer 5 is operated in the operating mode for detecting an input operation. Accordingly, if used in an input unit of a portable device such as a remote-controlled transmitter-receiver and a cell phone that cannot receive power from outside, the device can be used for a long time without exchange of a battery.

The microcomputer 5 outputs the reset signal from the reset output terminal (RESET) at the base point in time t0, thereby resetting register values in the first register (T) 6 and the second register (T-1) 7, and the count value of the counter 11 while clearing data stored in the RAM 10. Meanwhile, register values in the first register (T) 6 and the second register (T-1) are each "0" at a time when the detection cycle Tp ends, so that these register values are not necessarily required to be reset.

The microcomputer 5 outputs the switching control signal a for simultaneously switching the charge and discharge switches 4 of the respective capacitance-time conversion circuits 2 between the reference charge voltage Vdd and an open potential at the base point in time t0, thereby charging the stray capacitances Cs of the sensing electrodes 3 at a time ratio that corresponds to a duty ratio of 0.4. The electric potentials of the sensing electrodes 3 wherein the corresponding charge and discharge switches 4 have been switched to the ground potential GND until the base point in time t0 are at the ground potential GND that is equal to or lower than the threshold potential $V_{SH}$. Thus, the outputs c1, c2, c3 and c4 of the respective comparators 5 are all "L" at the base point in time t0, so that four-bit parallel data "0000" is stored in the first register (T) 6.

The register value comparison circuit 8 outputs a trigger signal to the counter 11 and the first register (T) 6 at the base point in time t0. The RAM 10 stores a count value C (t0) indicating the base point in time t0, and a register value "0000" stored in the first register (T) 6 at the base point in time t0 in association with each other as shown in FIG. 2.

Figure 3:
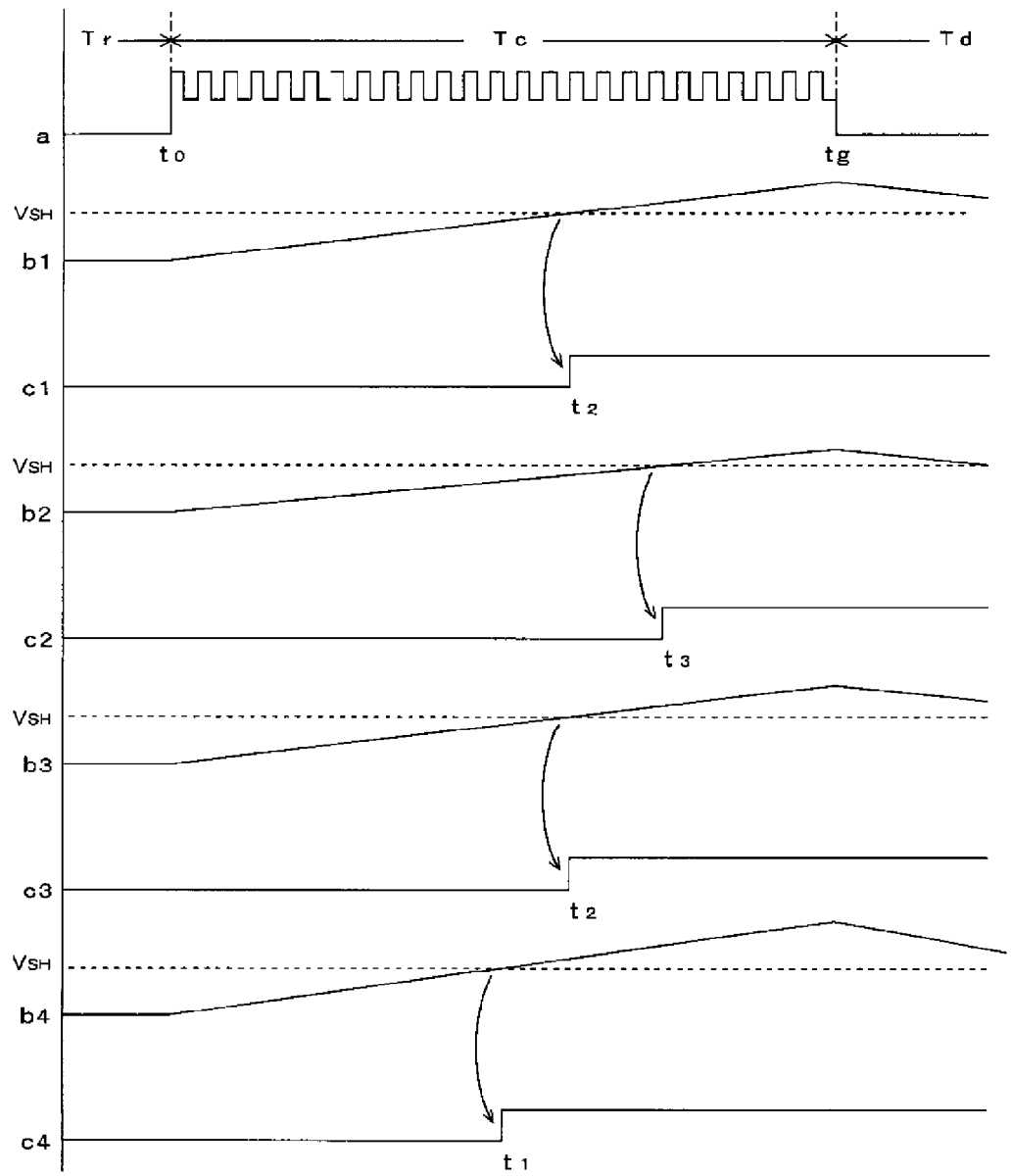
FIG. 3 shows a waveform chart explaining how a sensing electrode 3 an input unit approached is detected.

It is assumed that an input unit such as a finger to make an input operation approaches the position of the sensing electrode $3_2$. In this case, the stray capacitance $Cs_4$ of the sensing electrode $3_4$ which is far from the input unit and not influenced by the input unit becomes the lowest capacitance. Accordingly, the electric potential of the sensing electrode $3_4$ to increase in a stepwise manner with a time constant of the resistance values of the sensing resistors R1 and R2 exceeds the threshold potential $V_{SH}$ at the earliest time t1 as shown in FIG. 3. Then, the output c4 of the comparator 5 is inverted from "L" to "H," and parallel data "0001" the lowest-order bit of which is "1" is stored in the first register (T) 6. Since this register value differs from the register value "0000" stored in the second register (T-1) 7, the register value comparison circuit 8 outputs a trigger signal to the counter 11 and the first register (T) 6. Then, a count value C (t1) indicating the time t1 and the register value "0001" newly stored in the first register (T) 6 are stored in association with each other in the RAM 10.

Referring next to the sensing electrodes $3_1$ and $3_3$ which are arranged on opposite sides of the sensing electrode $3_2$ and spaced by the substantially same distance from the input unit approaching the sensing electrode $3_2$, the stray capacitances $Cs_1$ and $Cs_3$ thereof are higher than the stray capacitance $Cs_4$. When the electric potentials of the sensing electrodes $3_1$ and $3_3$ exceed the threshold potential $V_{SH}$ at a time t2, the outputs c1 and c3 of the comparators 5 are inverted from "L" to "H." Then, parallel data "1011" is stored in the first register (T) 6. Since the first and third bits of this register value differ from those of the register value "0001" stored in the second register (T-1) 7, the register value comparison circuit 8 outputs a trigger signal to the counter 11 and the first register (T) 6. Then, the register value "1011" newly stored in the first register (T) 6 is stored in association with a count value C (t2) indicating the time t2 in the RAM 10.

The stray capacitance $Cs_2$ of the sensing electrode $3_2$ nearest the input position is the highest among all the stray capacitances. Accordingly, the electric potential of the sensing electrode $3_2$ exceeds the threshold potential $V_{SH}$ at the latest time $t_3$ as shown in FIG. 3, and the output c3 of the comparator 5 is inverted from "L" to "H." As a result, parallel data "1111" is stored in the first register (T) 6 at the time $t_3$. Since this register value differs from the register value "1011" stored in the second register (T-1) 7, the register value comparison circuit 8 outputs a trigger signal to the counter 11 and the first register (T) 6. Then, a count value C (t3) indicating the time t3, and the register value "1111" stored in the first register (T) 6 are stored in association with each other in the RAM 10 as shown in FIG. 2.

The microcomputer 5 switches the respective charge and discharge switches 4 to the ground potential GND at the switching time tg after elapse of the charging time Tc from the base point in time t0. Then, the microcomputer 5 emits electric charges, which are stored in each stray capacitance Cs, during the discharging time Td to make the electric potentials of all the sensing electrodes 3 be the ground potential GND.

The electric potentials of all the sensing electrodes 3 are higher than the threshold potential $V_{SH}$ at the switching time tg. Accordingly, the register value "1111" stored in the first register (T) 6 does not change until the switching time tg. The microcomputer 5 reads a combination of each count value C (t) and a register value stored in the RAM 10 at the switching time tg. The count value C (t) indicates the elapsed time from the base point in time t0 when charge is started. The register value indicates bits the bit data of which changes compared with that of a register value in a preceding combination. The bits of each register value correspond to the stray capacitances Cs of the respective sensing electrodes 3, and elapsed time from the base point in time t0 is made longer by the magnitude of the stray capacitance Cs. Accordingly, the microcomputer 5 can compare the magnitudes of the stray capacitances Cs of the sensing electrodes 3 by referring to the data of each combination stored in the RAM 10. Here, as shown in FIG. 2, four-bit data changes in the fourth bit (LSB), in the first bit (MSB) and in the third bit, and in the second bit in this order. Accordingly, the stray capacitance Cs is found to increase from $Cs_4$, $Cs_1$ and $Cs_3$, and $Cs_2$ in this order. This allows the microcomputer 5 to determine that an input unit has approached the position of the sensing electrode $3_2$ with the highest stray capacitance $Cs_2$, thereby detecting an input operation made at the position of the sensing electrode $3_2$.

The microcomputer 5 outputs the input position thereby detected to an external control circuit for controlling cursor movement on a display screen or controlling the operation of an electronic device, and makes the external control circuit perform predetermined processing according to the input position.

The microcomputer 5 performs the detection described above to detect an input position and an input operation during the discharging time Td and the rest time Tr after the discharging time Td. After detecting the input operation, the microcomputer 5 clears data stored in the RAM 10 before the next base point in time t0 comes.

An input position may also be detected as follows. The magnitudes of the stray capacitances Cs of a plurality of sensing electrodes 3 are compared. Then, a position between the positions of the sensing electrodes 3, determined by a ratio obtained by proportionally dividing the plurality of stray capacitances Cs, is defined as an input position.

In the embodiment as described above, a description was given of the capacitive touch panel that regards the capacitances of a plurality of capacitors as the stray capacitances of a plurality of sensing electrodes, and compares the capacitances of the capacitors, thereby detecting an input operation to a sensing electrode having the highest stray capacitance. If the capacitance of a capacitor can be converted to a time that can be measured with a count value in a counter, the embodiment can also be applied to a capacitance determining device for comparing not only stray capacitances but also capacitances of capacitors of different types.

Circuit elements such as the register value comparison circuit 8, the first register (T) 6, and the second register (T-1) 7 may be incorporated into the microcomputer 5.

The charge and discharge switches 4 are described as those that make switchings among three types of switching terminals including the first switching terminals 41 at the reference charge voltage Vdd, the second switching terminals 42 at the ground potential GND, and the open third switching terminals 43. If an input operation is to be detected by either the charge control or the discharge control, the first or second switching terminal 41 or 42 may be omitted. Further, if control can be made by a predetermined duty ratio such that common terminals are connected with or separated from the first switching terminals 41 during the charge control, or that the common terminals are connected with or separated from the second switching terminals 42 during the discharge control, the open third switching terminal 43 is not required necessarily.

The present invention is suitably applied to a capacitive touch panel for detecting an input operation in a noncontact manner based on an electrostatic capacitance that changes slightly in response to the input operation.

What is claimed is:

1. A capacitive touch panel for detecting an input operation made at a position of a sensing electrode based on elapsed time that increases as a result of increase of a stray capacitance, the capacitive touch panel comprising:
   a sensing electrode arranged on an insulating panel, the sensing electrode increasing in stray capacitance in response to approach of an input unit;
   a resistive element forming a CR time constant circuit between the resistive element and a value of the stray capacitance of the sensing electrode;
   a charge and discharge switch for raising an electric potential of the sensing electrode from a ground potential to a predetermined charge potential or reducing the electric potential of the sensing electrode from the charge potential to the ground potential by connecting a common terminal on one side of the resistive element to a switching terminal that is either at the charge potential or at the ground potential from a base point in time to charge or discharge the stray capacitance with the time constant of the CR time constant circuit; and
   time measuring means for measuring elapsed time for the electric potential of the sensing electrode at the charge potential or ground potential to become the same as a predetermined threshold potential between the charge potential and the ground potential by charging or discharging the stray capacitance from the base point in time,
   wherein the switching of the charge and discharge switch is controlled by a PWM modulated signal obtained by pulse-width modulating a rectangular wave pulse signal at a fixed frequency by a predetermined modulation value, and the common terminal on one side of the resistive element is connected with or separated from the switching terminal in response to a binary signal value of the PWM modulated signal.

2. The capacitive touch panel according to claim 1, wherein the PWM modulated signal controls switching of connection of the common terminal of the charge and discharge switch among a first switching terminal at the charge voltage, a second switching terminal at the ground potential, and an open third switching terminal, and wherein the connection of the common terminal is switched in response to the binary signal value of the PWM modulated signal between the first and third switching terminals to charge the stray capacitance of the sensing electrode, and/or between the second and third switching terminals to discharge the stray capacitance of the sensing electrode.

3. The capacitive touch panel according to claim 1, wherein the resistive element and the charge and discharge switch are prepared for each one of a plurality of sensing electrodes arranged on an insulating panel while being insulated from each other, and wherein the elapsed times of the sensing electrodes measured by the time measuring means are compared, so that an input position is detected based on the position of a sensing electrode that increases in elapsed time.

* * * * *